(12) United States Patent
Hong et al.

(10) Patent No.: US 9,336,844 B2
(45) Date of Patent: May 10, 2016

(54) SEMICONDUCTOR DEVICE

(71) Applicant: SK hynix Inc., Icheon-si Gyeonggi-do (KR)

(72) Inventors: Duck Hwa Hong, Seoul (KR); Bok Rim Ko, Seoul (KR); Sang Il Park, Suwon-si (KR)

(73) Assignee: Sk hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 14/576,378

(22) Filed: Dec. 19, 2014

(65) Prior Publication Data

US 2016/0086644 A1    Mar. 24, 2016

(30) Foreign Application Priority Data

Sep. 23, 2014    (KR) .......................... 10-2014-0127059

(51) Int. Cl.
  *G11C 8/00* (2006.01)
  *G11C 8/12* (2006.01)
  *G11C 7/10* (2006.01)

(52) U.S. Cl.
  CPC ................ *G11C 8/12* (2013.01); *G11C 7/1048* (2013.01); *G11C 7/1087* (2013.01)

(58) Field of Classification Search
  CPC ............. G11C 7/222; G11C 29/12015; G11C 7/1051; G11C 7/1072; G11C 29/14; G11C 7/1045; G11C 2207/2254; G11C 29/02; G11C 29/023; G11C 29/028; G11C 29/50012; G11C 5/02; G11C 5/04; G11C 7/10
  USPC .................. 365/201, 230.01, 189.05, 189.15, 365/189.16, 193, 219, 233.12, 233.19
  See application file for complete search history.

(56) References Cited

U.S. PATENT DOCUMENTS

| | | | |
|---|---|---|---|
| 6,677,791 B2 * | 1/2004 | Okuda | ................. G11C 7/1051 327/156 |
| 7,522,467 B2 | 4/2009 | An | |
| 8,089,817 B2 | 1/2012 | Inaba | |

\* cited by examiner

*Primary Examiner* — Thong Q Le
(74) *Attorney, Agent, or Firm* — William Park & Associates Ltd.

(57) ABSTRACT

A semiconductor device includes a clock shifter configured to shift an active control signal by a predetermined number of clocks and output a shift signal according to a test signal; a command selection block configured to select any one of the active control signal and the shift signal according to the test signal, and output an active command signal; an active control block configured to control an active state of a bank active signal according to the active command signal; and an address latch block configured to latch an internal address according to the active command signal and the active control signal, and output a row address to a core region.

19 Claims, 12 Drawing Sheets

SEMICONDUCTOR DEVICE

The present application claims priority under 35 U.S.C. §119(a) to Korean application number 10-2014-0127059, filed on Sep. 23, 2014, in the Korean Intellectual Property Office, which is incorporated herein by reference in its entirety.

BACKGROUND

1. Technical Field

Various embodiments generally relate to a semiconductor device, and more particularly, to a technology for screening the characteristics of a semiconductor device.

2. Related Art

Usually, a semiconductor memory device has a plurality of banks. A bank as a function unit capable of being independently accessed includes a memory cell array, a sense amplifier array, an address decoder, and so forth.

In general, in the case of accessing a specific memory cell of a specific bank, first, an active command for controlling a row line is applied, and a row (a word line) of the corresponding bank is activated. Then, read/write commands for controlling a column line are applied, and sense amplification and re-storage processes for a specific column (a bit line) are performed. Thereafter, when the access to the corresponding bank is ended, a precharge command is applied, and the row of the corresponding bank is deactivated.

Probe test equipment screens a DRAM chip at a low frequency. According to the specification of a semiconductor device, in the case of active, write, read or precharge, a command signal should be inputted at a high frequency. In the case of a semiconductor device of a high frequency specification, a next read command may be inputted only when a long time (for example, 4 clocks) passes after an active command.

SUMMARY

In an embodiment, a semiconductor device may include a clock shifter configured to shift an active control signal by a predetermined number of clocks and output a shift signal according to a test signal. The semiconductor device may also include a command selection block configured to select any one of the active control signal and the shift signal according to the test signal, and output an active command signal. The semiconductor device may also include an active control block configured to control an active state of a bank active signal according to the active command signal. Further, the semiconductor device may also include an address latch block configured to latch an internal address according to the active command signal and the active control signal, and output a row address to a core region.

In an embodiment, a semiconductor device may include a clock shifter configured to shift a precharge control signal by a predetermined number of clocks and output a shift signal in response to a test signal. The semiconductor device may also include a command selection block configured to select any one of the precharge control signal and the shift signal according to the test signal, and output a precharge command signal. The semiconductor device may also include a precharge control block configured to control an active state of a precharge signal according to the precharge command signal, and control a precharge operation of a core region.

DETAILED DESCRIPTION

Hereinafter, a semiconductor device will be described below with reference to the accompanying figures through various embodiments. Various embodiments are directed to internally controlling external commands and screening core AC parameters through a test mode.

Figure 1:
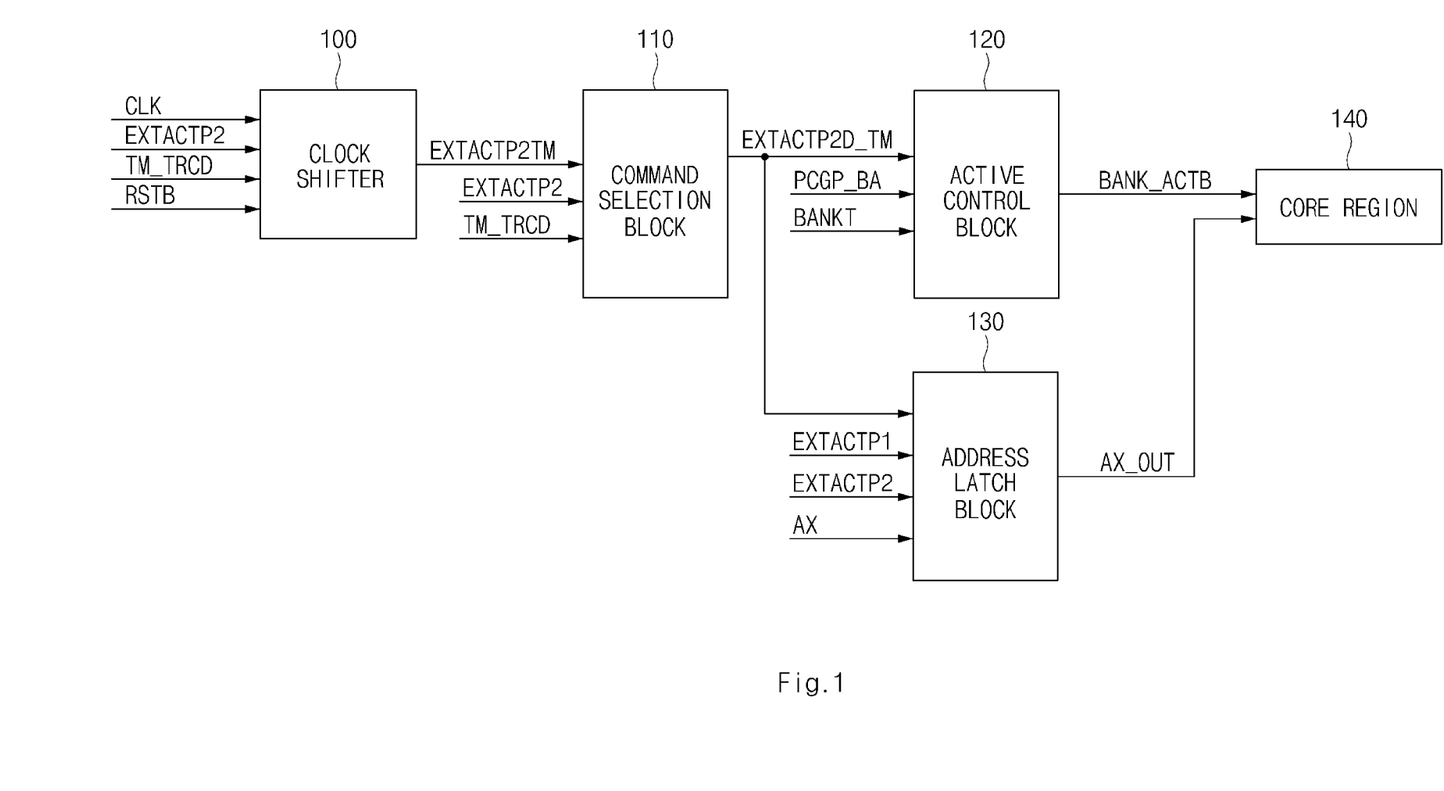
FIG. 1 is a configuration diagram illustrating a representation of an example of a semiconductor device in accordance with an embodiment.

Referring to FIG. 1, a configuration diagram illustrating a representation of an example of a semiconductor device in accordance with an embodiment is shown.

A semiconductor device in accordance with an embodiment includes a clock shifter 100, a command selection block 110, an active control block 120, an address latch block 130, and a core region 140.

The clock shifter 100 outputs a shift signal EXTACTP2TM according to a clock CLK, an active control signal EXTACTP2, a test signal TM_TRCD and a reset signal RSTB. Such a clock shifter 100 shifts the active control signal EXTACTP2 by a predetermined time in synchronization with the clock CLK and activates the shift signal EXTACTP2TM where the test signal TM_TRCD is activated.

After a row address is transferred to a bank along with an active command, a column address is transferred to the bank. A time that elapses for this is defined as a tRCD (RAS to CAS delay) in a specification. The tRCD means a time during which a word line is enabled by a row address, a sense amplifier sufficiently operates and the data of the sense amplifier becomes accessible.

A short tRCD as possible is regarded as an index for excellent performance. In an embodiment, the test signal TM_TRCD corresponds to a test signal to screen such a tRCD characteristic.

The command selection block 110 outputs an active command signal EXTACTP2D_TM according to the shift signal EXTACTP2TM, the active control signal EXTACTP2 and the test signal TM_TRCD. Such a command selection block 110 selects any one of the shift signal EXTACTP2TM clock-shifted according to the test signal TM_TRCD and the active control signal EXTACTP2. The command selection block 110 also outputs the active command signal EXTACTP2D_TM.

The active control block 120 outputs a bank active signal BANK_ACTB to the core region 140 according to the active command signal EXTACTP2D_TM, a precharge signal PCGP_BA and a bank select signal BANKT. Such an active control block 120 controls the activated state of the bank active signal BANK_ACTB in correspondence to the active command signal EXTACTP2D_TM. Further, the active control block 120 controls the bank active signal BANK_ACTB in correspondence to the precharge signal PCGP_BA in a precharge mode.

The address latch block 130 latches an internal address AX according to the active command signal EXTACTP2D_TM and active control signals EXTACTP1 and EXTACTP2. The address latch block 130 also outputs a selected row address AX_OUT to the core region 140.

The core region 140 performs an operation corresponding to the row address AX_OUT applied from the address latch block 130 when the bank active signal BANK_ACTB is activated. The core region 140 may include a plurality of banks. The operation corresponding to the row address AX_OUT may be a read or write active operation, a precharge operation or a refresh operation.

Figure 2:
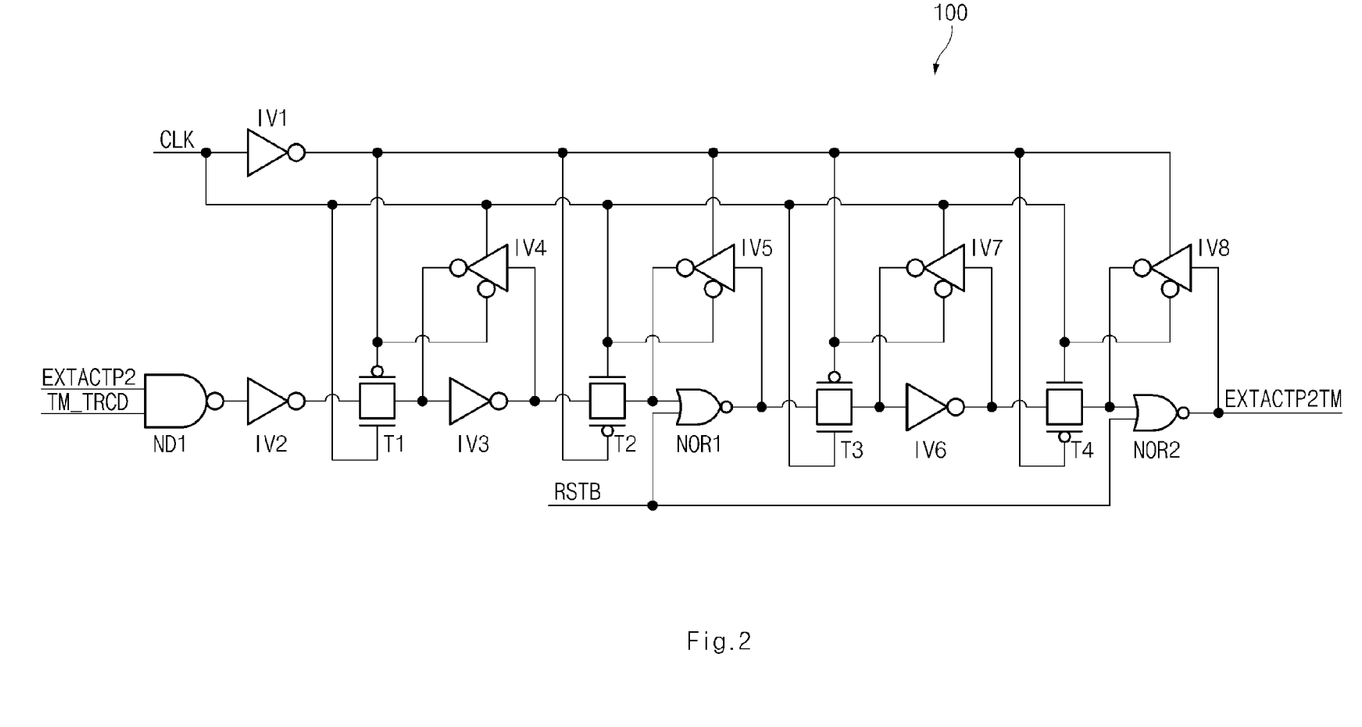
FIG. 2 is a detailed circuit diagram illustrating a representation of an example of the clock shifter shown in FIG. 1.

Referring to FIG. 2, a detailed circuit diagram illustrating a representation of an example of the clock shifter 100 shown in FIG. 1 is illustrated.

The clock shifter 100 includes a plurality of inverters IV1 to IV8, a plurality of transfer gates T1 to T4, a plurality of NOR gates NOR1 and NOR2, and a NAND gate ND1.

The NAND gate ND1 NANDs or performs a NAND logic function on the active control signal EXTACTP2 and the test signal TM_TRCD. Where both the active control signal EXTACTP2 and the test signal TM_TRCD are in active states, the NAND gate ND1 and the inverter IV2 combine those signals and output a signal with a high level.

The transfer gate T1 selectively outputs the output signal of the inverter IV2 by the clock CLK and an inverted clock generated by inverting the clock CLK by the inverter IV1. Where the clock CLK is a high level, the transfer gate T1 is turned on and transfers the output signal of the inverter IV2 to the inverter IV3. Where the clock CLK is a low level, the transfer gate T1 is turned off, and a latch IV3 and IV4 stores a previous signal. The inverters IV3 and IV4, which have a latch structure, latch the output of the transfer gate T1.

The transfer gate T2 selectively outputs the output signal of the inverter IV3 by the clock CLK and the inverted clock generated by inverting the clock CLK by the inverter IV1. Where the clock CLK is the high level, the transfer gate T2 is turned on and transfers the output signal of the inverter IV3 to the NOR gate NOR1. Where the clock CLK is the low level, the transfer gate T2 is turned off, and a latch IV5 and NOR1 stores a previous signal. The inverter IV5 and the NOR gate NOR1, which have a latch structure, latch the output of the transfer gate T2. The NOR gate NOR1 may be reset according to the reset signal RSTB.

The transfer gate T3 selectively outputs the output signal of the NOR gate NOR1 by the clock CLK and the inverted clock generated by inverting the clock CLK by the inverter IV1. Where the clock CLK is the high level, the transfer gate T3 is turned on and transfers the output signal of the NOR gate NOR1 to the inverter IV6. Where the clock CLK is the low level, the transfer gate T3 is turned off, and a latch IV6 and IV7 stores a previous signal. The inverters IV6 and IV7, which have a latch structure, latch the output of the transfer gate T3.

The transfer gate T4 selectively outputs the output signal of the inverter IV6 by the clock CLK and the inverted clock generated by inverting the clock CLK by the inverter IV1. Where the clock CLK is the high level, the transfer gate T4 is turned on and transfers the output signal of the inverter IV6 to the NOR gate NOR2. Where the clock CLK is the low level, the transfer gate T4 is turned off, and a latch IV8 and NOR2 stores a previous signal. The inverter IV8 and the NOR gate NOR2, which have a latch structure, latch the output of the transfer gate T4. The NOR gate NOR2 may be reset according to the reset signal RSTB.

The clock shifter 100 having the above-described configuration shifts the active control signal EXTACTP2 by a predetermined clock period in synchronization with the clock CLK and outputs the shift signal EXTACTP2TM, in the state in which the test signal TM_TRCD is activated to a high level.

In other words, in order to test the characteristic of a tRCD with a high frequency through low frequency test equipment, the activation timing of the active control signal EXTACTP2 is delayed through a test mode. By activating the shift signal EXTACTP2TM with a timing conforming to a low frequency characteristic, a bank active operation is controlled.

Figure 3:
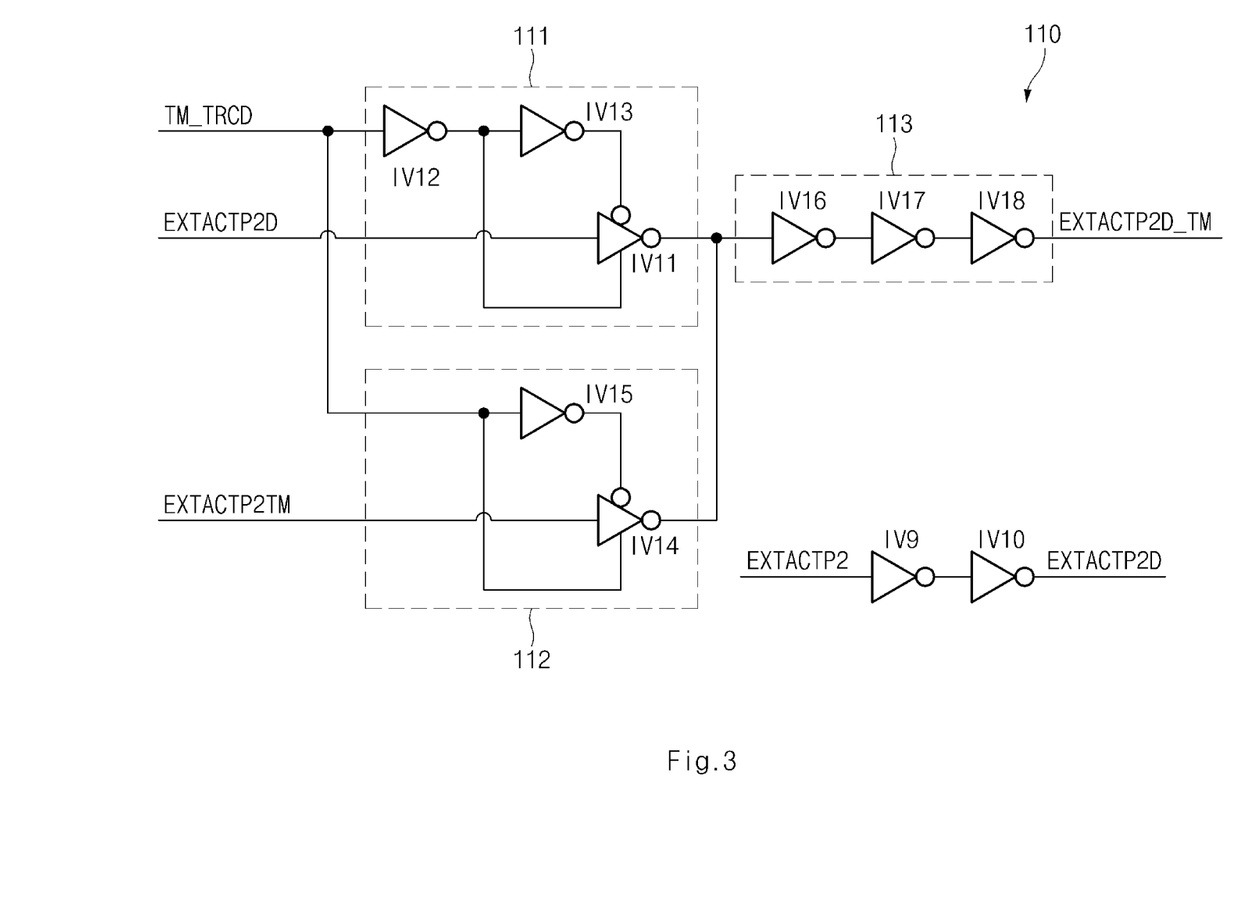
FIG. 3 is a detailed circuit diagram illustrating a representation of an example of the command selection block shown in FIG. 1.

Referring to FIG. 3, a detailed circuit diagram illustrating a representation of an example of the command selection block 110 shown in FIG. 1 is illustrated.

The command selection block 110 includes an active signal selection unit 111, a shift signal selection unit 112, and a delay unit 113.

The active signal selection unit 111 selects an active delay signal EXTACTP2D and outputs the active delay signal EXTACTP2D to the delay unit 113 according to the test signal TM_TRCD. The active delay signal EXTACTP2D is a signal generated by non-invertingly delaying the active control signal EXTACTP2 by inverters IV9 and IV10.

Such an active signal selection unit 111 includes a plurality of inverters IV11 to IV13. The inverter IV12 inverts the test signal TM_TRCD. The inverter IV13 non-invertingly delays the test signal TM_TRCD. The inverter IV11 selectively and invertingly drives the active delay signal EXTACTP2D in correspondence to the output of the inverter IV13.

The shift signal selection unit 112 selects the shift signal EXTACTP2TM and outputs the shift signal EXTACTP2TM to the delay unit 113 according to the test signal TM_TRCD. Such a shift signal selection unit 112 includes a plurality of inverters IV14 and IV15. The inverter IV15 inverts the test signal TM_TRCD. The inverter IV14 selectively and invertingly drives the shift signal EXTACTP2TM in correspondence to the output of the inverter IV15.

The delay unit 113 invertingly delays the output of the inverter IV11 or the inverter IV14 and outputs the active command signal EXTACTP2D_TM. The delay unit 113 includes a plurality of inverters IV16 to IV18.

A command selection block 110 selects the clock-shifted shift signal EXTACTP2TM and outputs the active command signal EXTACTP2D_TM. Alternatively, the command selection block 110 selects the active control signal EXTACTP2 and outputs the active command signal EXTACTP2D_TM, according to the state of the test signal TM_TRCD.

Namely, where the test signal TM_TRCD is the high level, the shift signal selection unit 112 is selected and outputs the shift signal EXTACTP2TM as the active command signal EXTACTP2D_TM. Conversely, where the test signal TM_TRCD is a low level, the active signal selection unit 111 is selected and outputs the active delay signal EXTACTP2D as the active command signal EXTACTP2D_TM.

Figure 4:
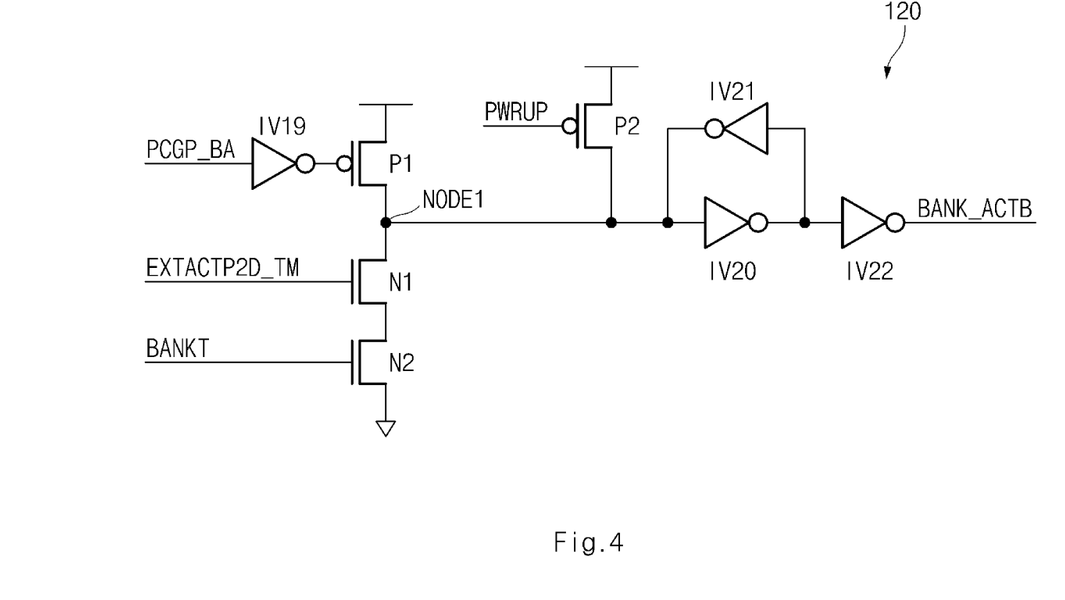
FIG. 4 is a detailed circuit diagram illustrating a representation of an example of the active control block shown in FIG. 1.

Referring to FIG. 4, a detailed circuit diagram illustrating a representation of an example of the active control block 120 shown in FIG. 1 is illustrated.

The active control block 120 controls the bank active operation in correspondence to the active command signal EXTACTP2D_TM in the test mode. Such an active control block 120 includes a plurality of inverters IV19 to IV22, PMOS transistors P1 and P2, and NMOS transistors N1 and N2.

The PMOS transistor P1 and the NMOS transistors N1 and N2 are electrically coupled in series between a power supply terminal and a ground terminal. The PMOS transistor P1 is applied with an inverted precharge signal generated by inverting the precharge signal PCGP_BA by the inverter IV19 through the gate terminal thereof. The NMOS transistor N1 is applied with the active command signal EXTACTP2D_TM through the gate terminal thereof. The NMOS transistor N2 is applied with the bank select signal BANKT through the gate terminal thereof.

The PMOS transistor P2 is electrically coupled between the power supply terminal and a node NODE1. The PMOS transistor P2 is applied with a power-up signal PWRUP through the gate terminal thereof. Where the power-up signal PWRUP is a low level, the node NODE1 is pulled up to a power supply voltage.

The inverters IV20 and IV21, which have a latch structure, latch the output signal of the node NODE1. The inverter IV22 invertingly drives the output of the inverter IV20 and outputs the bank active signal BANK_ACTB to the core region 140.

In the active control block 120 having the above-described configuration, if a corresponding bank is selected by the bank select signal BANKT, both the NMOS transistors N1 and N2 are turned on. Accordingly, the bank active signal BANK_ACTB is activated to a low level state in correspondence to the active command signal EXTACTP2D_TM. In addition, in the active control block 120, if the precharge signal PCGP_BA becomes a high level in the precharge mode, the PMOS transistor P1 is turned on and deactivates the bank active signal BANK_ACTB to a high level state.

Figure 5:
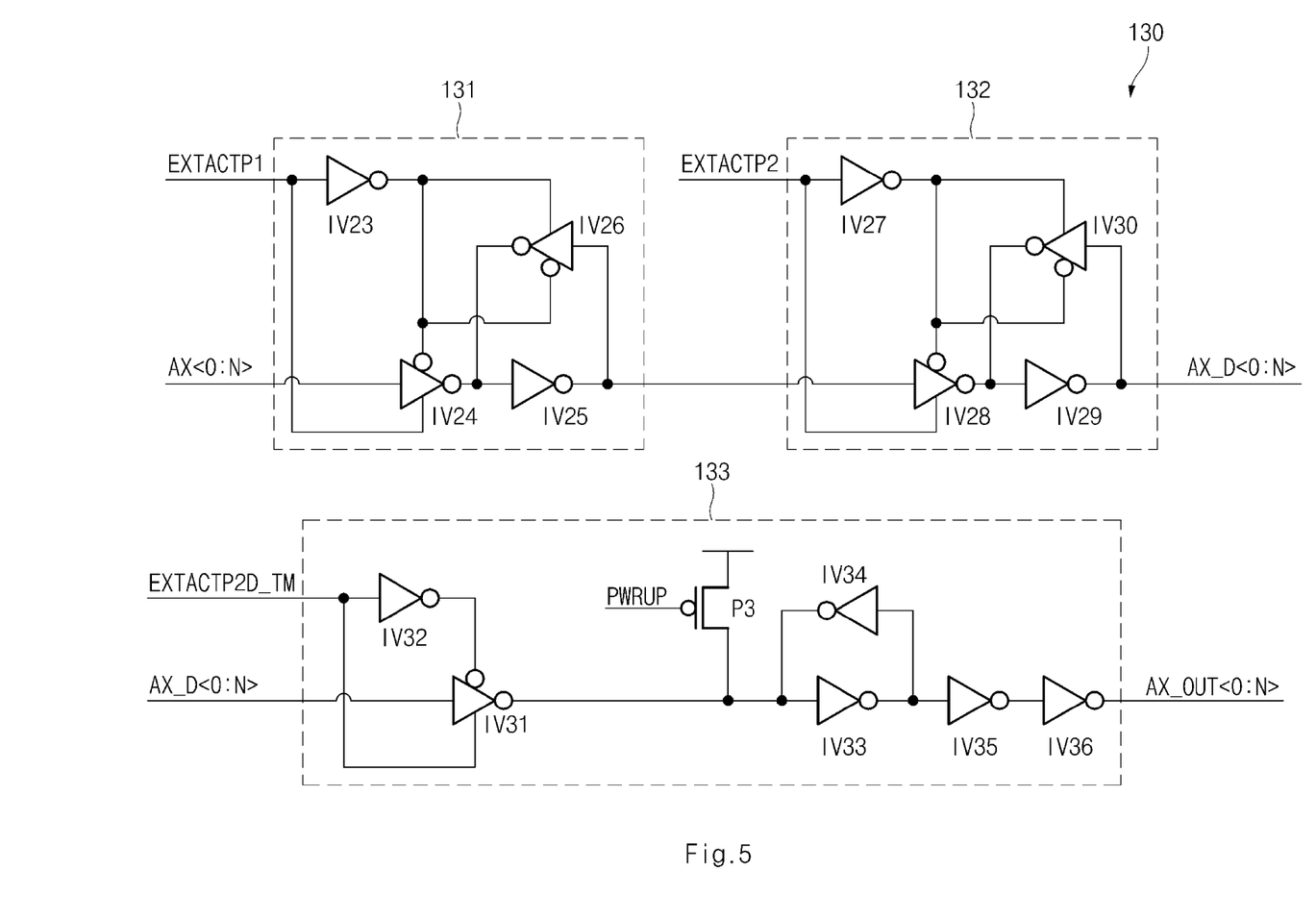
FIG. 5 is a detailed circuit diagram illustrating a representation of an example of the address latch block shown in FIG. 1.

Referring to FIG. 5, a detailed circuit diagram illustrating a representation of an example of the address latch block 130 shown in FIG. 1 is illustrated.

The address latch block 130 includes a first latch unit 131, a second latch unit 132, and an address output unit 133.

The first latch unit 131 latches the internal address AX<0:N> according to the active control signal EXTACTP1. Such a first latch unit 131 includes a plurality of inverters IV23 to IV26.

The inverter IV24 invertingly drives the internal address AX according to the states of the active control signal EXTACTP1 and an inverted active control signal generated by inverting the active control signal EXTACTP1 by the inverter IV23. The inverters IV25 and IV26, which are electrically coupled to have a latch structure, latch the output of the inverter IV24 according to the inverted active control signal generated by inverting the active control signal EXTACTP1 by the inverter IV23.

More specifically, the first latch unit 131 having the above-described configuration is inputted with the internal address AX<0:N> where the active control signal EXTACTP1 is a high level. The first latch unit 131 latches the internal address AX<0:N> where the active control signal EXTACTP1 is a low level.

The second latch unit 132 latches the output of the first latch unit 131 according to the active control signal EXTACTP2. Such a second latch unit 132 includes a plurality of inverters IV27 to IV30.

The inverter IV28 invertingly drives the output of the first latch unit 131 according to the states of the active control signal EXTACTP2 and an inverted active control signal generated by inverting the active control signal EXTACTP2 by the inverter IV27. The inverters IV29 and IV30, which are electrically coupled to have a latch structure, latch the output of the inverter IV28 according to the inverted active control signal generated by inverting the active control signal EXTACTP2 by the inverter IV27, and output a latch address AX_D<0:N>.

More specifically, the second latch unit 132 having the above-described configuration is inputted with the output address of the first latch unit 131 where the active control signal EXTACTP2 is a high level. The second latch unit 132 latches the inputted address and outputs the latch address AX_D<0:N> where the active control signal EXTACTP2 is a low level.

The address output unit 133 includes a plurality of inverters IV31 to IV36 and a PMOS transistor P3. The inverter IV31 invertingly drives the latch address AX_D<0:N> according to the states of the active command signal EXTACTP2D_TM and an inverted active command signal generated by inverting the active command signal EXTACTP2D_TM by the inverter IV32.

The PMOS transistor P3 is electrically coupled between the power supply terminal and the output terminal of the inverter IV31, and is applied with the power-up signal PWRUP through the gate terminal thereof. The PMOS transistor P3 pull-up drives the output terminal of the inverter IV31 to the level of the power supply voltage where the power-up signal PWRUP is the low level.

The inverters IV33 and IV34, which have a latch structure, latch the output of the inverter IV31. The inverters IV35 and IV36 non-invertingly drive the output of the inverter IV33, and output the row address AX_OUT<0:N> to the core region 140.

The address latch block 130 having the above-described configuration latches the internal address AX<0:N> through the first latch unit 131 during the activation period of the active control signal EXTACTP1. The address latch block 130 also latches the output of the first latch unit 131 through the second latch unit 132 during the activation period of the active control signal EXTACTP2. The address latch block 130 latches the latch address AX_D<0:N> and outputs the row address AX_OUT<0:N> in correspondence to the active timing of the active command signal EXTACTP2D_TM.

Figure 6:
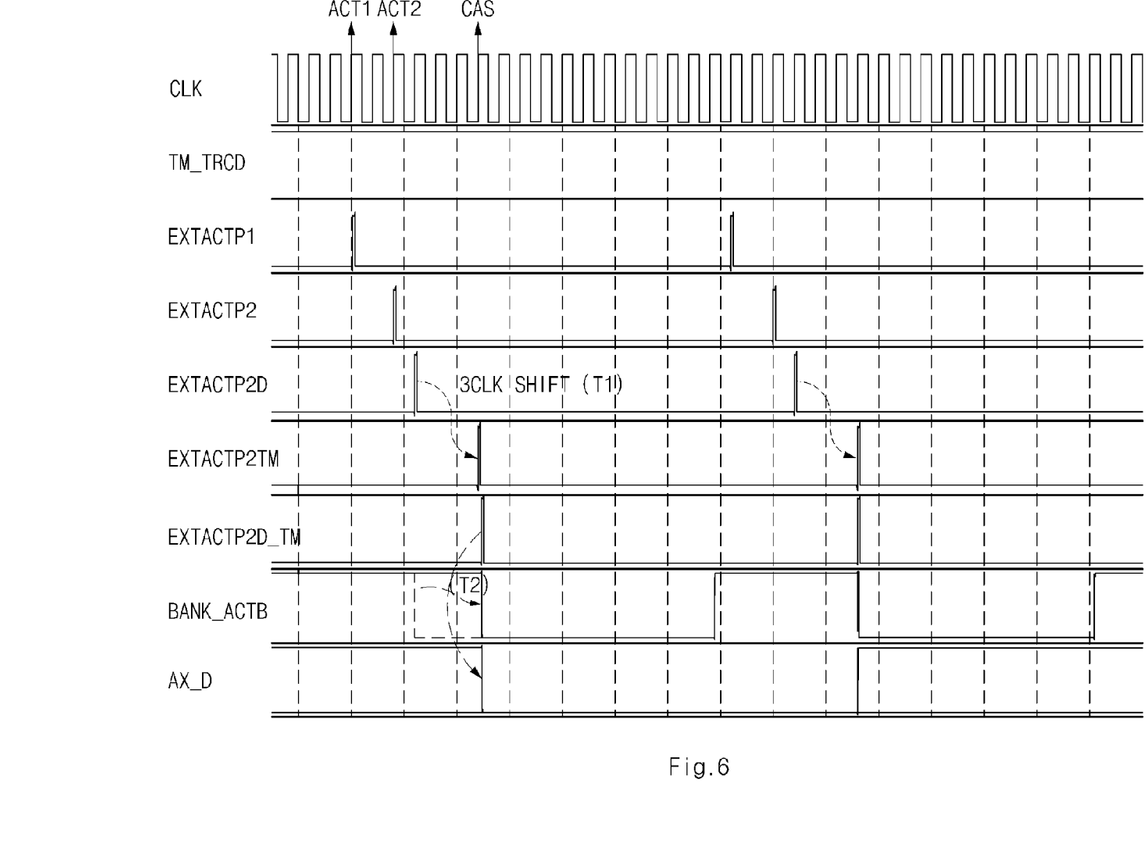
FIG. 6 is an operation timing diagram in accordance with the embodiment of FIG. 1.

The operation processes of the semiconductor device in accordance with an embodiment, configured as mentioned above, will be described below with reference to the operation timing diagram of FIG. 6.

First, if a first active command ACT1 corresponding to a selected bank is enabled to a high level, the active control signal EXTACTP1 is activated. The active control signal EXTACTP1 is inputted in synchronization with the rising edge of a first clock CLK. As the active control signal EXTACTP1 is activated to the high level, the internal address AX<0:N> is inputted and is latched by the first latch unit 131.

Thereafter, if a second active command ACT2 is enabled to the high level, the active control signal EXTACTP2 is activated. The active control signal EXTACTP2 is inputted in synchronization with the rising edge of a third clock CLK. As the active control signal EXTACTP2 is activated to the high level, the output of the first latch unit 131 is transferred and is latched by the second latch unit 132.

The active control signals EXTACTP1 and EXTACTP2 are activated to the high levels with a predetermined time difference. In particular, the active control signal EXTACTP1 is activated to the high level earlier than the active control signal EXTACTP2. In an embodiment, it will be described as an example that the second active command ACT2 is activated when 2 clocks pass after the first active command ACT1 is activated.

It is described as examples in an embodiment that the active control signals EXTACTP1 and EXTACTP2 are activated in synchronization with the rising edges of the active commands ACT1 and ACT2. However, it is to be noted that an embodiment is not limited to such examples and the active control signals EXTACTP1 and EXTACTP2 may be activated in synchronization with the falling edges of the active commands ACT1 and ACT2.

If the active command signal EXTACTP2D_TM is activated to a high level, the address output unit 133 outputs the row address AX_OUT to the core region 140 in synchronization with the activation timing of the active command signal EXTACTP2D_TM. The core region 140 performs a read or write active operation, a precharge operation or a refresh operation for a corresponding bank, by using the row address AX_OUT.

The active delay signal EXTACTP2D is activated to a high level. The active delay signal EXTACTP2D is a signal generated by non-invertingly delaying the active control signal EXTACTP2 by the inverters IV9 and IV10. It will be described as an example in an embodiment that the active delay signal EXTACTP2D is activated to the high level when 1 clock is delayed after the active control signal EXTACTP2 is activated.

If the test signal TM_TRCD is activated to the low level, the command selection block 110 does not select the active delay signal EXTACTP2D generated by the active control signal EXTACTP2 but selects the shift signal EXTACTP2TM as a signal generated by shifting the active delay signal EXTACTP2D by a predetermined number of clocks (by a period T1). In an embodiment, the period T1 may correspond to a range from after the second active command ACT2 is applied to before a column address strobe signal CAS is applied.

If the shift signal EXTACTP2TM is activated to a high level, the command selection block 110 activates the active command signal EXTACTP2D_TM to a high level in correspondence to the shift signal EXTACTP2TM. Accordingly, the active control block 120 activates the bank active signal BANK_ACTB to the low level in synchronization with the active timing of the active command signal EXTACTP2D_TM.

In an embodiment, the bank active signal BANK_ACTB is activated to the low level when a predetermined period (for example, a period T2) is delayed after the active delay signal EXTACTP2D is activated.

Figure 7:
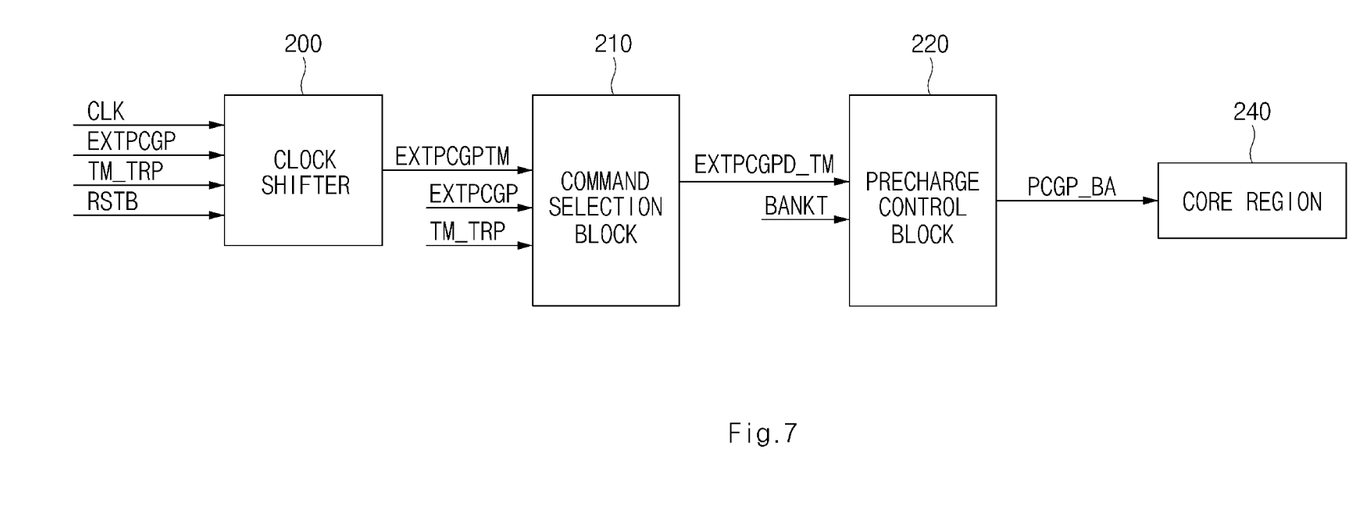
FIG. 7 is a configuration diagram illustrating a representation of an example of a semiconductor device in accordance with an embodiment.

Referring to FIG. 7, a configuration diagram illustrating a representation of an example of a semiconductor device in accordance with an embodiment is shown.

A semiconductor device in accordance with an embodiment includes a clock shifter 200, a command selection block 210, a precharge control block 220, and a core region 240.

The clock shifter 200 outputs a shift signal EXTPCGPTM according to a clock CLK, a precharge control signal EXTPCGP, a test signal TM_TRP and a reset signal RSTB. Such a clock shifter 200 shifts the precharge control signal EXTPCGP by a predetermined time in synchronization with the clock CLK and activates the shift signal EXTPCGPTM where the test signal TM_TRP is activated.

In order to input next data in a precharge state, an active operation should be preceded. How quickly an active command may be applied is related with the characteristic of a tRP (precharge time). The tRP characteristic is an index that indicates how quickly a chip may enter a standby state after a precharge command is applied. In an embodiment, the test signal TM_TRP corresponds to a test signal to screen such a tRP characteristic.

The command selection block 210 outputs a precharge command signal EXTPCGPD_TM according to the shift signal EXTPCGPTM, the precharge control signal EXTPCGP and the test signal TM_TRP. Such a command selection block 210 selects any one of the shift signal EXTPCGPTM clock-shifted according to the test signal TM_TRP and the precharge control signal EXTPCGP. The command selection block 210 also outputs the precharge command signal EXTPCGPD_TM.

The precharge control block 220 outputs a precharge signal PCGP_BA to the core region 240 according to the precharge command signal EXTPCGPD_TM and a bank select signal BANKT. Such a precharge control block 220 controls the activated state of the precharge signal PCGP_BA in correspondence to the precharge command signal EXTPCGPD_TM.

The core region 240 precharges a bank according to the precharge signal PCGP_BA. The core region 240 may include a plurality of banks.

Figure 8:
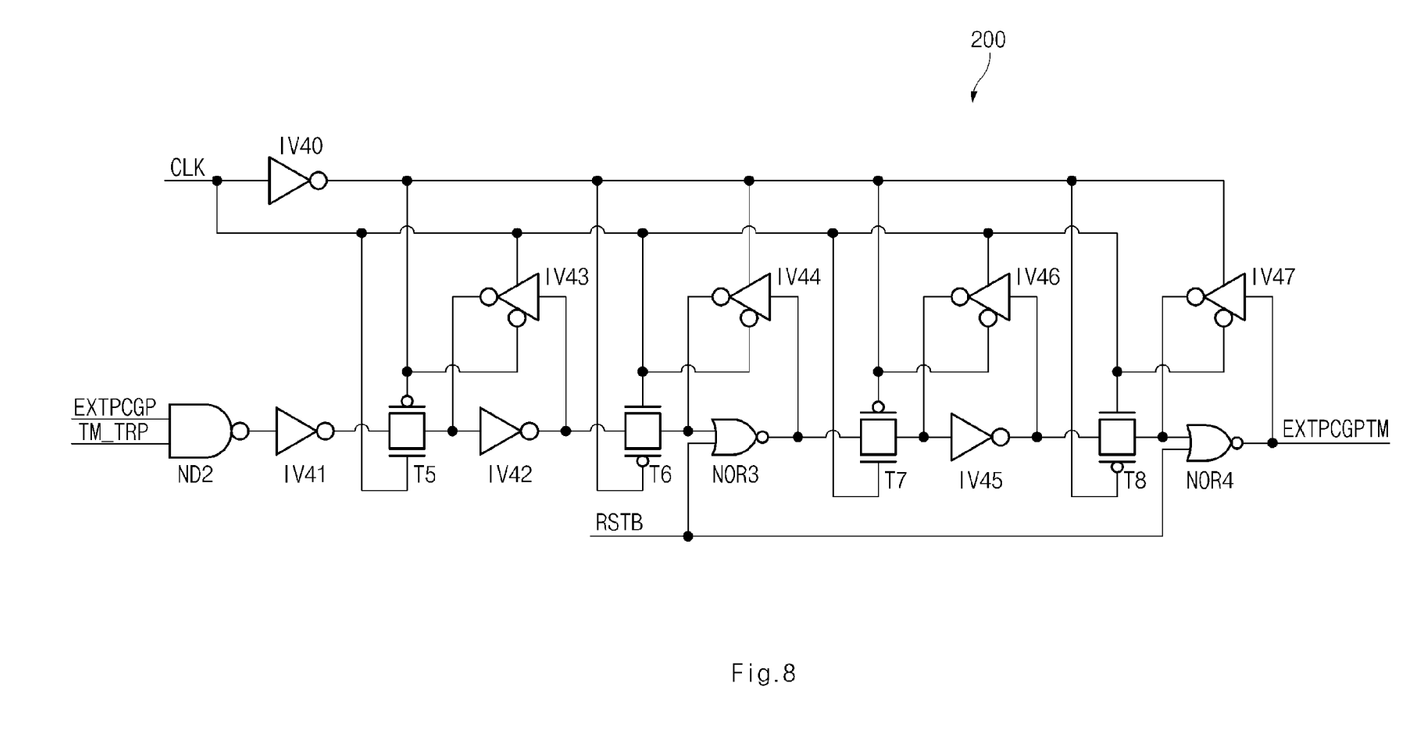
FIG. 8 is a detailed circuit diagram illustrating a representation of an example of the clock shifter shown in FIG. 7.

Referring to FIG. 8, a detailed circuit diagram illustrating a representation of an example of the clock shifter 200 shown in FIG. 7 is illustrated.

The clock shifter 200 includes a plurality of inverters IV40 to IV47, a plurality of transfer gates T5 to T8, a plurality of NOR gates NOR3 and NOR4, and a NAND gate ND2.

The NAND gate ND2 NANDs or performs a NAND logic function on the precharge control signal EXTPCGP and the test signal TM_TRP. Where both the precharge control signal EXTPCGP and the test signal TM_TRP are in active states, the NAND gate ND2 and the inverter IV41 combine those signals and output a signal with a high level.

The transfer gate T5 selectively outputs the output signal of the inverter IV41 by the clock CLK and an inverted clock generated by inverting the clock CLK by the inverter IV40. Where the clock CLK is a high level, the transfer gate T5 is turned on and transfers the output signal of the inverter IV41 to the inverter IV42. Where the clock CLK is a low level, the transfer gate T5 is turned off, and a latch IV42 and IV43 stores a previous signal. The inverters IV42 and IV43, which have a latch structure, latch the output of the transfer gate T5.

The transfer gate T6 selectively outputs the output signal of the inverter IV42 by the clock CLK and the inverted clock generated by inverting the clock CLK by the inverter IV40. Where the clock CLK is the high level, the transfer gate T6 is turned on and transfers the output signal of the inverter IV42 to the NOR gate NOR3. When the clock CLK is the low level, the transfer gate T6 is turned off, and a latch IV44 and NOR3 stores a previous signal. The inverter IV44 and the NOR gate NOR3, which have a latch structure, latch the output of the transfer gate T6. The NOR gate NOR3 may be reset according to the reset signal RSTB.

The transfer gate T7 selectively outputs the output signal of the NOR gate NOR3 by the clock CLK and the inverted clock generated by inverting the clock CLK by the inverter IV40. When the clock CLK is the high level, the transfer gate T7 is turned on and transfers the output signal of the NOR gate NOR3 to the inverter IV45. Where the clock CLK is the low level, the transfer gate T7 is turned off, and a latch IV45 and IV46 stores a previous signal. The inverters IV45 and IV46, which have a latch structure, latch the output of the transfer gate T7.

The transfer gate T8 selectively outputs the output signal of the inverter IV45 by the clock CLK and the inverted clock generated by inverting the clock CLK by the inverter IV40. When the clock CLK is the high level, the transfer gate T8 is turned on and transfers the output signal of the inverter IV45 to the NOR gate NOR4. Where the clock CLK is the low level, the transfer gate T8 is turned off, and a latch IV47 and NOR4 stores a previous signal. The inverter IV47 and the NOR gate NOR4, which have a latch structure, latch the output of the transfer gate T8. The NOR gate NOR4 may be reset according to the reset signal RSTB.

The clock shifter 200 having the above-described configuration shifts the precharge control signal EXTPCGP by a predetermined clock period in synchronization with the clock CLK and outputs the shift signal EXTPCGPTM, in the state in which the test signal TM_TRP is activated to a high level.

In other words, in order to test the characteristic of a tRP with a high frequency through low frequency test equipment, the activation timing of the precharge control signal EXTPCGP is delayed through a test mode. By activating the shift signal EXTPCGPTM with a timing conforming to a low frequency characteristic, a bank precharge operation is controlled.

Figure 9:
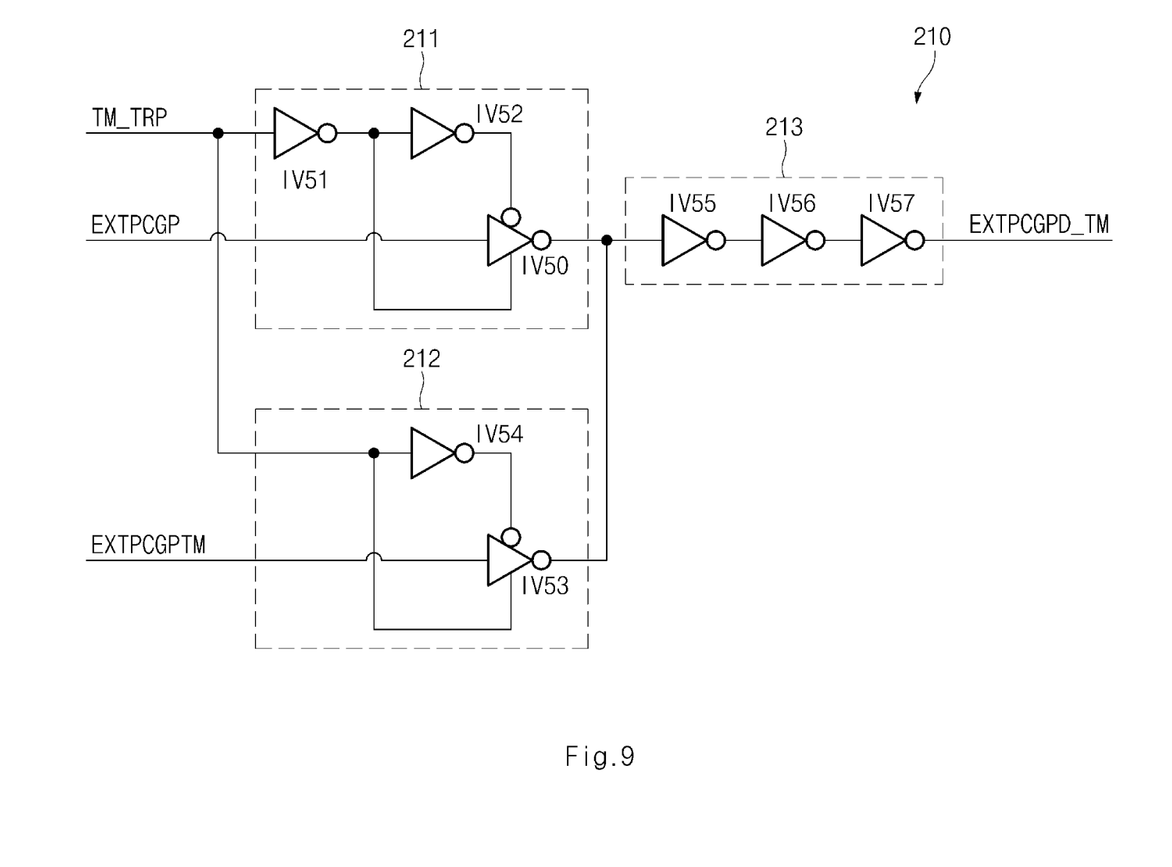
FIG. 9 is a detailed circuit diagram illustrating a representation of an example of the command selection block shown in FIG. 7.

Referring to FIG. 9, a detailed circuit diagram illustrating a representation of an example of the command selection block 210 shown in FIG. 7 is illustrated.

The command selection block 210 includes a precharge signal selection unit 211, a shift signal selection unit 212, and a delay unit 213.

The precharge signal selection unit 211 selects the precharge control signal EXTPCGP and outputs the precharge control signal EXTPCGP to the delay unit 213, according to the test signal TM_TRP. Such a precharge signal selection unit 211 includes a plurality of inverters IV50 to IV52. The inverter IV51 inverts the test signal TM_TRP. The inverter IV52 non-invertingly delays the test signal TM_TRP. The inverter IV50 selectively and invertingly drives the precharge control signal EXTPCGP in correspondence to the output of the inverter IV52.

The shift signal selection unit 212 selects the shift signal EXTPCGPTM and outputs the shift signal EXTPCGPTM to the delay unit 213 according to the test signal TM_TRP. Such a shift signal selection unit 212 includes a plurality of inverters IV53 and IV54. The inverter IV54 inverts the test signal TM_TRP. The inverter IV53 selectively and invertingly drives the shift signal EXTPCGPTM in correspondence to the output of the inverter IV54.

The delay unit 213 invertingly delays the output of the inverter IV50 or the inverter IV53 and outputs the precharge command signal EXTPCGPD_TM. The delay unit 213 includes a plurality of inverters IV55 to IV57.

Such a command selection block 210 selects the clock-shifted shift signal EXTPCGPTM and outputs the precharge command signal EXTPCGPD_TM. In the alternative, the command selection block 210 selects the precharge control signal EXTPCGP and outputs the precharge command signal EXTPCGPD_TM according to the state of the test signal TM_TRP.

When the test signal TM_TRP is the high level, the shift signal selection unit 212 is selected and outputs the shift signal EXTPCGPTM as the precharge command signal EXTPCGPD_TM. Conversely, where the test signal TM_TRP is a low level, the precharge signal selection unit 211 is selected and outputs the precharge control signal EXTPCGP as the precharge command signal EXTPCGPD_TM.

Figure 10:
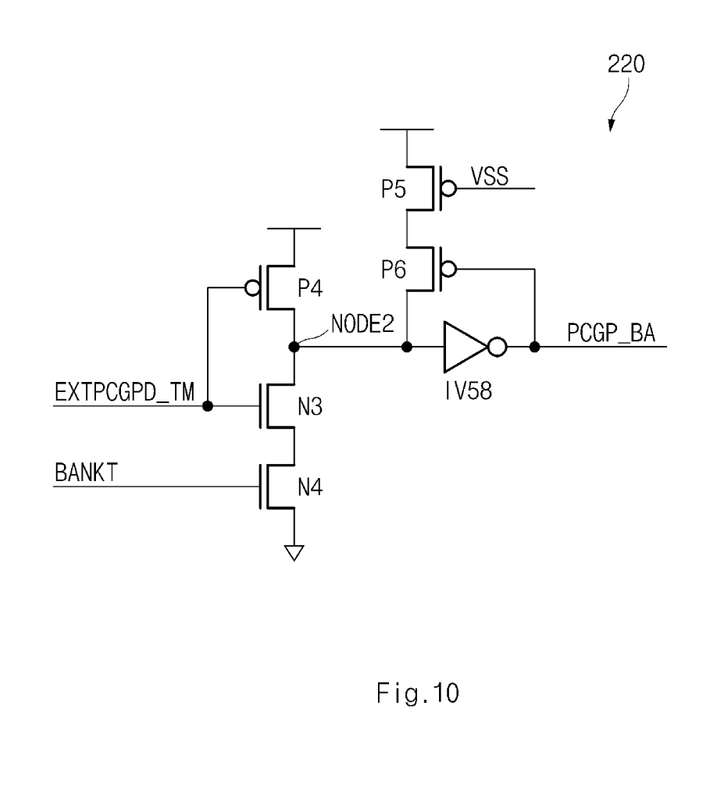
FIG. 10 is a detailed circuit diagram illustrating a representation of an example of the precharge control block shown in FIG. 7.

Referring to FIG. 10, a detailed circuit diagram illustrating a representation of an example of the precharge control block 220 shown in FIG. 7 is illustrated.

The precharge control block 220 controls the bank precharge operation in correspondence to the precharge command signal EXTPCGPD_TM in the test mode. Such a precharge control block 220 includes an inverter IV58, a plurality of PMOS transistors P4 to P6, and NMOS transistors N3 and N4.

The PMOS transistor P4 and the NMOS transistors N3 and N4 are electrically coupled in series between a power supply terminal and a ground terminal. The PMOS transistor P4 is applied with the precharge command signal EXTPCGPD_TM through the gate terminal thereof. The NMOS transistor N3 is applied with the precharge command signal EXTPCGPD_TM through the gate terminal thereof. The NMOS transistor N4 is applied with the bank select signal BANKT through the gate terminal thereof.

The PMOS transistors P5 and P6 are electrically coupled in series between the power supply terminal and a node NODE2. The PMOS transistor P5 is applied with a ground voltage VSS through the gate terminal thereof and always retains a turned-on state. The PMOS transistor P6 is applied with the precharge signal PCGP_BA through the gate terminal thereof. The inverter IV58 inverts the output of the node NODE2 and outputs the precharge signal PCGP_BA to the core region 240.

In the precharge control block 220 having the above-described configuration, if a corresponding bank is selected by the bank select signal BANKT, the NMOS transistor N4 is turned on. Accordingly, the precharge signal PCGP_BA is activated to a high level state in correspondence to the precharge command signal EXTPCGPD_TM. In addition, in the precharge control block 220, if the precharge command signal EXTPCGPD_TM becomes a low level, the PMOS transistor P4 is turned on and deactivates the precharge signal PCGP_BA to a low level state.

Figure 11:
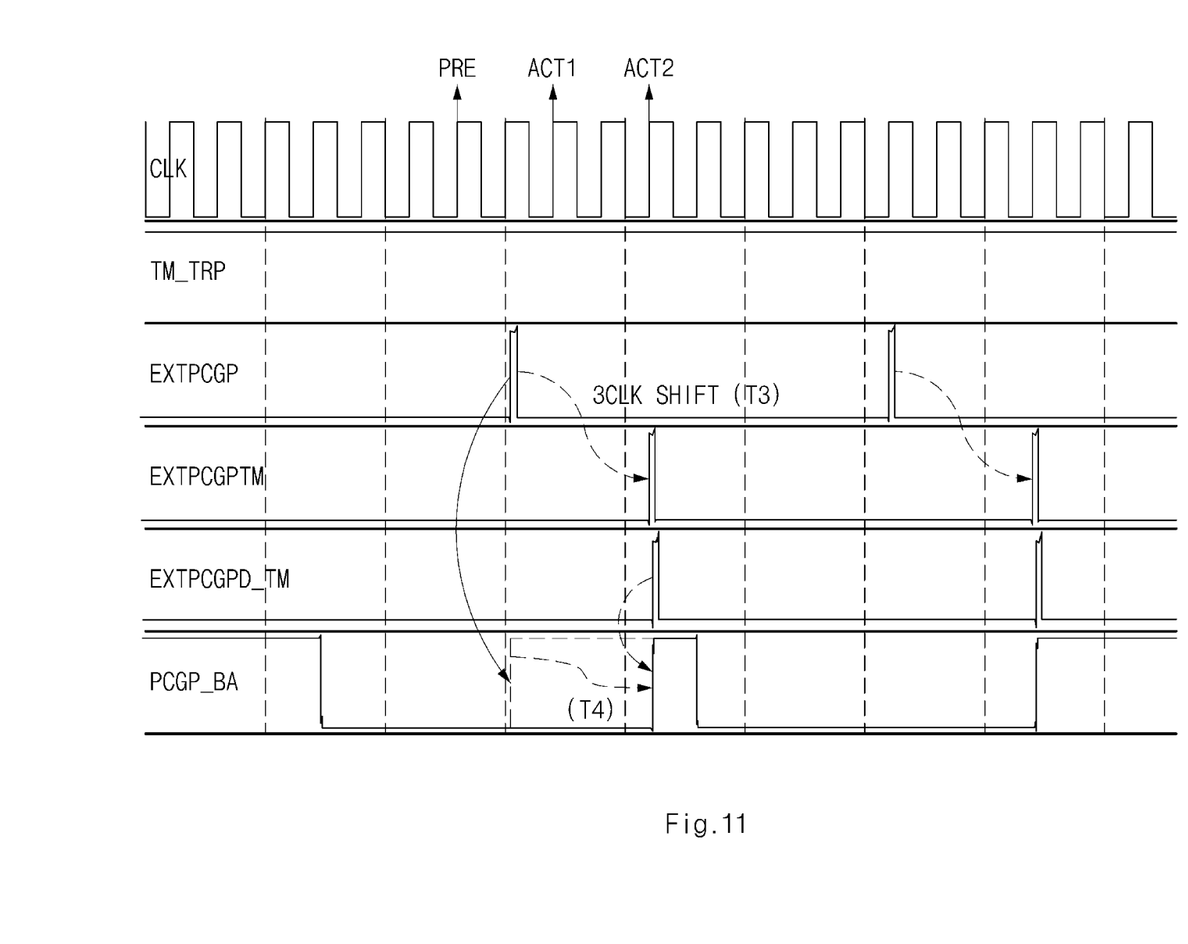
FIG. 11 is an operation timing diagram in accordance with the embodiment of FIG. 7.

The operation processes of the semiconductor device in accordance with an embodiment configured as mentioned above, will be described below with reference to the operation timing diagram of FIG. 11.

First, if a precharge command PRE corresponding to a selected bank is enabled to a high level, the precharge control signal EXTPCGP is activated. The precharge control signal EXTPCGP is activated in synchronization with the rising edge of a clock CLK after 1 clock is delayed from when the precharge command PRE is applied.

A first active command ACT1 is applied when 2 clocks pass after the precharge command PRE is activated. A second active command ACT2 is applied when 2 clocks pass after the first active command ACT1 is applied.

It is described as examples in an embodiment that the precharge control signal EXTPCGP and the shift signal EXTPCGPTM are activated in synchronization with the rising edges of clocks CLK. However, an embodiment is not limited to such examples and the precharge control signal EXTPCGP and the shift signal EXTPCGPTM may be activated in synchronization with the falling edges of clocks CLK.

The precharge control signal EXTPCGP is activated to a high level when 1 clock passes after the precharge command PRE is activated to the high level. If the precharge control signal EXTPCGP is activated to the high level, the shift signal EXTPCGPTM, which has a timing shifted by a predetermined number of clocks (for example, 3 clocks) by the clock shifter 200, is activated. It will be described as an example in an embodiment that the shift signal EXTPCGPTM is activated in synchronization with the rising edge of the second active command ACT2.

If the test signal TM_TRP is activated to the low level, the command selection block 210 does not select the precharge control signal EXTPCGP, but selects the shift signal EXT-PCGPTM as a signal generated by shifting the precharge control signal EXTPCGP by the predetermined number of clocks (by a period T3).

If the shift signal EXTPCGPTM is activated to a high level, the command selection block 210 activates the precharge command signal EXTPCGPD_TM to a high level in correspondence to the shift signal EXTPCGPTM. Accordingly, the precharge control block 220 activates the precharge signal PCGP_BA to the high level in synchronization with the active timing of the precharge command signal EXTPCGPD_TM.

In an embodiment, the precharge signal PCGP_BA is activated to the high level when a predetermined period (for example, a period T4) is delayed after the precharge control signal EXTPCGP is activated.

Figure 12:
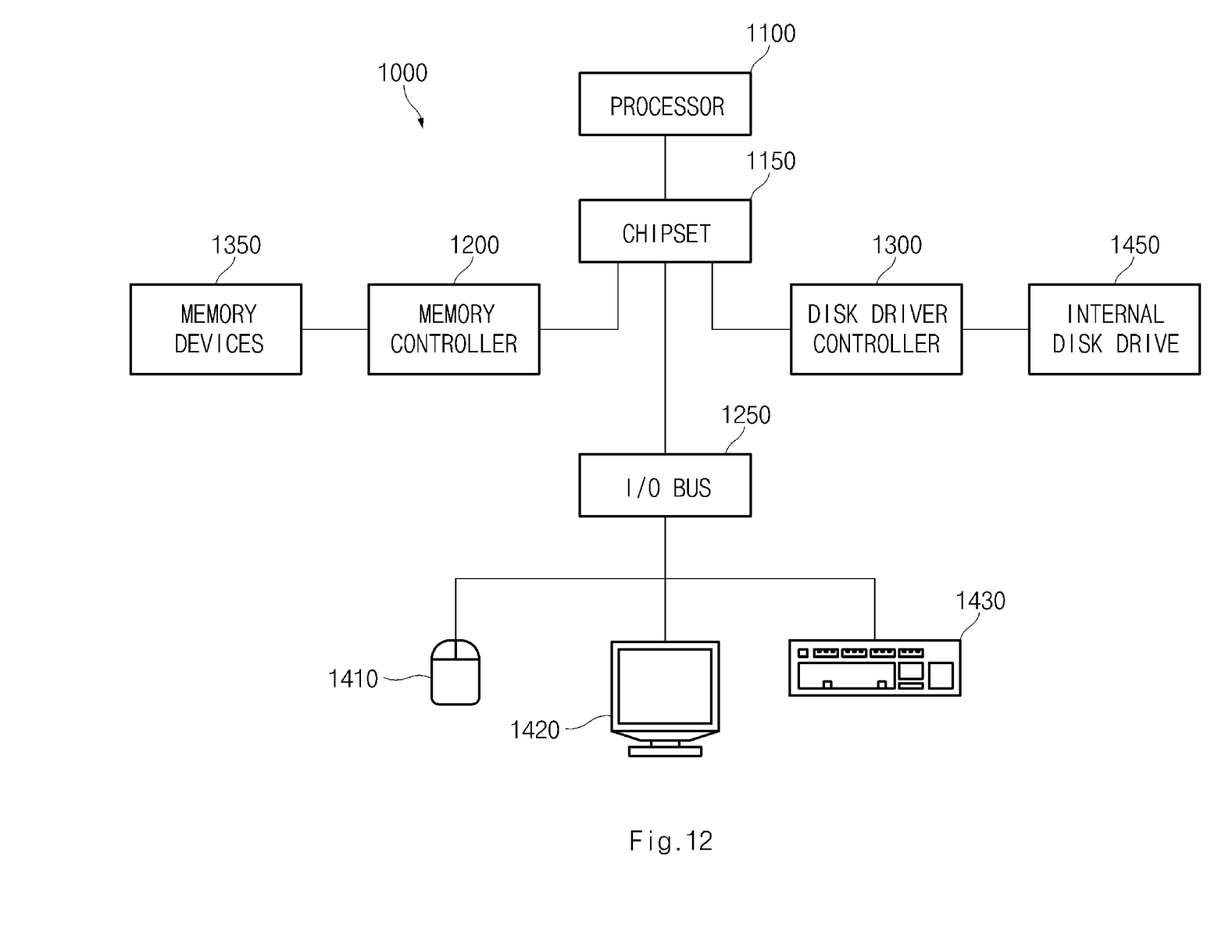
FIG. 12 illustrates a block diagram of a system employing a memory controller circuit in accordance with an embodiment of the invention.

Referring to FIG. 12, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the semiconductor device described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1410, or a keyboard 1430. The I/O bus 1250 may employ any one of a number of communications protocols to communicate with the I/O devices 1410, 1420 and 1430.

The disk drive controller 1300 may also be electrically coupled to the chipset 1105. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

As is apparent from the above descriptions, the embodiments provide advantages in that it is possible to efficiently test the characteristics of core AC parameters by using low frequency equipment in conformity with a change in the specification of a semiconductor device.

While various embodiments have been described above, it will be understood to those skilled in the art that the embodiments described are by way of examples only. Accordingly, the semiconductor device described should not be limited based on the described embodiments.

What is claimed is:

1. A semiconductor device comprising:
a clock shifter configured to shift an active control signal by a predetermined number of clocks and output a shift signal according to a test signal;
a command selection block configured to select any one of the active control signal and the shift signal according to the test signal, and output an active command signal;
an active control block configured to control an active state of a bank active signal according to the active command signal; and
an address latch block configured to latch an internal address according to the active command signal and the active control signal, and output a row address to a core region,
wherein the active control block deactivates and outputs the bank active signal according to a precharge signal.

2. The semiconductor device according to claim 1, wherein a shifting period of the clock shifter corresponds to a range from after an active command is applied to before a column address strobe signal is applied.

3. The semiconductor device according to claim 1, wherein the command selection block selects the shift signal where the test signal is activated and selects the active control signal where the test signal is deactivated.

4. The semiconductor device according to claim 1, wherein the command selection block comprises:
an active signal selection unit configured to select the active control signal when the test signal is deactivated; and
a shift signal selection unit configured to select the shift signal when the test signal is activated.

5. The semiconductor device according to claim 4, wherein the command selection block further comprises:
a delay unit configured to delay outputs of the active signal selection unit and the shift signal selection unit by a predetermined time, and output the active command signal.

6. The semiconductor device according to claim 1, wherein the active control block outputs the bank active signal in a row active state when the active command signal and a bank select signal are activated.

7. The semiconductor device according to claim 1, wherein the address latch block comprises:
a first latch unit configured to latch the internal address according to a first active control signal;
a second latch unit configured to latch an output of the first latch unit according to a second active control signal, and output a latch address; and
an address output unit configured to latch the latch address according to the active command signal and output the row address.

8. The semiconductor device according to claim 7, wherein the second active control signal is activated later than the first active control signal.

9. The semiconductor device according to claim 1, wherein the active control signal is activated after a second active command is applied.

10. The semiconductor device according to claim 1, wherein the shift signal is activated after 3 clocks from when an active delay signal generated by delaying the active control signal by a preselected time is activated.

11. A semiconductor device comprising:
a clock shifter configured to shift a precharge control signal by a predetermined number of clocks and output a shift signal in response to a test signal;

a command selection block configured to select any one of the precharge control signal and the shift signal according to the test signal, and output a precharge command signal; and a precharge control block configured to control an active state of a precharge signal according to the precharge command signal, and control a precharge operation of a core region.

12. The semiconductor device according to claim 11, wherein a shifting period of the clock shifter corresponds to a range from after a precharge command is applied to before a second active command is applied.

13. The semiconductor device according to claim 11, wherein the command selection block selects the shift signal where the test signal is activated and selects the precharge control signal where the test signal is deactivated.

14. The semiconductor device according to claim 11, wherein the command selection block comprises:
   a precharge signal selection unit configured to select the precharge control signal when the test signal is deactivated; and
   a shift signal selection unit configured to select the shift signal when the test signal is activated.

15. The semiconductor device according to claim 14, wherein the command selection block further comprises:
   a delay unit configured to delay outputs of the precharge signal selection unit and the shift signal selection unit by a predetermined time, and output the precharge command signal.

16. The semiconductor device according to claim 11, wherein the precharge control block outputs the precharge signal in a high active state according to the precharge command signal and a bank select signal.

17. The semiconductor device according to claim 11, wherein the precharge control block deactivates and outputs the precharge signal when the precharge command signal is deactivated.

18. The semiconductor device according to claim 11, wherein the precharge control signal is activated after 1 clock from when the precharge command is applied.

19. The semiconductor device according to claim 11, wherein the shift signal is activated after 3 clocks from when the precharge control signal is activated.

* * * * *